(12) United States Patent
Chien et al.

(10) Patent No.: US 6,509,223 B2
(45) Date of Patent: Jan. 21, 2003

(54) METHOD FOR MAKING AN EMBEDDED MEMORY MOS

(75) Inventors: Sun-Chieh Chien, Hsin-Chu (TW); Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 93 days.

(21) Appl. No.: 09/764,334

(22) Filed: Jan. 19, 2001

(65) Prior Publication Data

US 2002/0098650 A1 Jul. 25, 2002

(51) Int. Cl.$^7$ .......................................... H01L 21/8238
(52) U.S. Cl. ...................... 438/241; 438/231; 438/258; 438/275; 438/532
(58) Field of Search ................................ 438/231, 258, 438/275, 305, 241, 532, FOR 188

(56) References Cited

U.S. PATENT DOCUMENTS

| | | | | |
|---|---|---|---|---|
| 4,717,684 A | * | 1/1988 | Katto et al. | |
| 5,329,482 A | * | 7/1994 | Nakajima et al. | |
| 5,648,282 A | * | 7/1997 | Yoneda | |
| 5,863,820 A | * | 1/1999 | Huang et al. | |
| 5,908,311 A | * | 6/1999 | Chi et al. | |
| 5,972,764 A | * | 10/1999 | Huang et al. | |
| 6,037,222 A | * | 3/2000 | Huang et al. | |
| 6,300,206 B1 | * | 10/2001 | Fukada et al. | |
| 6,346,442 B1 | * | 2/2002 | Aloni et al. | |
| 6,387,759 B1 | * | 5/2002 | Park et al. | |

* cited by examiner

Primary Examiner—George Fourson
Assistant Examiner—Joannie Adelle Garcia
(74) Attorney, Agent, or Firm—Winston Hsu

(57) ABSTRACT

The present invention provides a method for forming an embedded memory MOS. The method involves first forming a first dielectric layer and an undoped polysilicon layer, respectively, on the surface of the semiconductor wafer with a defined memory array area and a periphery circuits region. Then, the undoped polysilicon layer in the memory array area is doped to become a doped polysilicon layer, followed by the formation of a protective layer on the surface of the semiconductor wafer. Thereafter, a first photolithographic and etching process(PEP) is used to etch the protective layer and the doped polysilicon layer in the memory array area to form a plurality of gates, and to form lightly doped drains (LDD) adjacent to each gate. A silicon nitride layer and a second dielectric layer are formed, followed by their removal in the periphery circuits region. Finally, a second PEP is used to etch the undoped polysilicon layer in the periphery circuits region to form a plurality of gates, as well as to form LDDs, spacers and sources/drains(S/D) of each MOS in the periphery circuits region.

17 Claims, 8 Drawing Sheets

METHOD FOR MAKING AN EMBEDDED MEMORY MOS

BACKGROUND OF THE INVENTION

1. Field of the Invention

The present invention provides a method for forming an embedded memory MOS.

2. Description of the Prior Art

Due to continued process of integration, it is the present trend to produce semiconductor integrated circuits that simultaneously integrate a memory cell array and high-speed logic circuit elements onto a single chip. The result is the formation of an embedded memory which simultaneously combines a memory cell array and logic circuits, so as to save space and to enhance the speed of signal processing.

Please refer to FIG. 1 to FIG. 8. FIG. 1 to FIG. 8 are the cross-sectional schematic diagrams of making an embedded memory MOS on a semiconductor wafer 10 according to the prior art. The semiconductor wafer 10 comprises a silicon substrate 16, with a memory array area 12 and a periphery circuits region 14 defined on the silicon substrate 16. The memory array area 12 further comprises a single cell-well 18, and the periphery circuits region 14 further comprises a P-well 20 and a N-well 22. Each well is isolated by a plurality of shallow trenches 11.

As shown in FIG. 1, the method for forming an embedded memory MOS according to the prior art involves first forming a silicon oxide layer on the surface of the silicon substrate 16 via a thermal oxidation method, for use as a gate oxide layer 24 of each MOS. Thereafter, an undoped polysilicon layer 26 and an insulation layer 28 are formed, respectively, on the surface of the gate oxide layer 24. Then as shown in FIG. 2, a photoresist layer 30 is formed in the periphery circuits region 14 as a hard mask, whereby a photolithographic and etching process (PEP) are used to etch both the insulation layer 28 and the undoped polysilicon layer 26, located in the memory array area 12, down to the surface of silicon oxide layer 24.

After completely removing the photoresist layer 30, as shown in FIG. 3, a doped polysilicon layer 32, a silicide layer 34, an insulation layer 36 and a silicon nitride layer 38 are formed, respectively, on the surface of the insulation layer 28. As shown in FIG. 4, then a photoresist layer 40 is formed on the surface of the semiconductor wafer 10, and a plurality of gate patterns 41 are defined in the photoresist layer 40 in the memory array area 12, Thereafter, each of the gate patterns 41 are used as a hard mask to etch the silicon nitride layer 38, the insulation layer 36, the silicide layer 34 and the doped polysilicon layer 32, located in the memory array area, down to the surface of the gate oxide layer 24 on the silicon substrate 16. As a result, gates 41 of each MOS is formed in the memory array area 12. Then, an ion implantation process is performed to form the lightly doped drains (LDD)42 of each MOS in the memory array area.

After removing the photoresist layer 40 and the gate oxide layer 24 not covered by each of the gate 41, as shown in FIG. 5, an insulation layer 44 is first formed on the surface of the semiconductor wafer 10, whereby the thickness of the insulation layer 44 is greater than the total thickness of each layer in the periphery circuits region 14. Then, the silicon nitride layer 38 in the periphery circuits region 14 is used as a stop layer in the proceeding chemical-mechanical polishing (CMP) process to horizontally align both the surfaces of the insulation layer 44 in the memory array area 12 and the silicon nitride layer 38 in the periphery circuits region 14.

As shown in FIG. 6, the silicon nitride layer 38, the insulation layer 36, the silicide layer 34, the doped polysilicon layer 32 and the insulation layer 28, located in the periphery circuits region 14, are etched down to the surface of the undoped polysilicon layer 26. Then, a photoresist layer 46 is formed on the surface of the semiconductor wafer 10, followed by a photolithographic process to define a plurality of gate patterns 47 of both the PNOS and MMOS in the photoresist layer 46 in the periphery circuits region 14. Then, each of the gate patterns 47 in the photoresist layer 46 is used as a hard mask, with the insulation layer 44 in the memory array area 12 simultaneously acting as a hard mask to protect each of the gate 41 structure in the memory array area 12, to etch the undoped polysilicon layer 26 in the periphery circuits region 14 down to the surface of the gate oxide layer 24 to form the gates 47 of the PMOS and NMOS. Then, an ion implantation process is performed to form the lightly doped drains(LDD)42 of each PMOS and NMOS.

As shown in FIG. 7, a silicon nitride layer (not indicated) is formed on the surface of the semiconductor wafer 10, followed by an anisotropic etching process to form a spacer 48 located on either side of each gate 47 in the periphery circuits region 14. Next, two photolithographic processes followed by an ion implantation process of two different implantation areas are used to form a source 50 and a drain 52 of the NMOS and PMOS above the P-well 20 and N-well 22 in the periphery circuits region 14.

Finally as shown in FIG. 8, a metal layer (not indicated) composed of Ti metal is sputtered on the surface of the semiconductor wafer 10. Then, a rapid thermal process (RTP) with a temperature range of 500° C.~700° C. and a heating duration of approximately 30 seconds is used in order to allow the titanium atoms in the metal layer to diffuse into the surface of each source 50, drain 52 and gate 47 in the periphery circuits region 14. Then, a wet etching process is used to remove the unreacted metal layer on the surface of the semiconductor wafer 10. A second rapid thermal process (RTP) with a temperature range of 700° C.~900° C. and a heating duration of approximately 30 seconds is used to form a self aligned silicide layer 54 on the surfaces of the source 50, drain 52 and gate 47 in the periphery circuits area 14.

The gate 41 in memory array area 12 is required to have a cap layer 38 in order to make the successive self-aligned contact(SAC) process proceed smoothly. However, a cap layer cannot be formed on the surface of the gates 24 in the periphery circuits region 14. Thus, surface sheet resistance (Rs) of each source 50, drain 52 and gate 47 in the successive self aligned silicide(salicide) process cannot be lowered. Therefore, in the prior art method for making the embedded memory MOS, repeated photolithographic and etching processes are needed to integrate the formation of gates in the memory array area and the periphery circuits region. The result is an increase in both process complexity and production cost, as well as a reduction in throughput.

SUMMARY OF THE INVENTION

It is therefore a primary objective of the present invention to provide a method of making an embedded memory MOS, so as to integrate the manufacturing process of the gates in both the memory array area and the periphery circuits region to simplify the manufacturing process.

The method according to the present invention involves first forming a first dielectric layer and an undoped polysilicon layer on the surface of semiconductor wafer with a defined memory array area and a periphery circuits region. Then, doping of the undoped polysilicon layer in the memory array area occurs, followed by the formation of a protective layer on the surface of the semiconductor wafer. Thereafter, a first photolithographic and etching(PEP) process is used to etch the protective layer and the doped polysilicon layer in the memory array area to form a plurality of gates, followed by the formation of a lightly doped drain(LDD) adjacent to each gate. Next, a silicon nitride layer and a second dielectric layer are formed on the surface of the semiconductor wafer, followed by the removal of the second dielectric layer, the silicon nitride layer and the protective layer. Finally, a second PEP is performed to etch the undopedpolysilicon layer in the periphery circuits region to form a plurality of gates, followed by the formation of a LDD, spacer and source/drain(S/D) of each MOS in the periphery circuits region.

It is an advantage of the present invention that the method for making the embedded memory MOS integrates the manufacturing process of gates in the memory array area and the periphery circuits region. Another advantage of the present invention is a decrease in the thermal budget of the self aligned silicide process. The result achieves a decrease in both process complexity and production cost.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
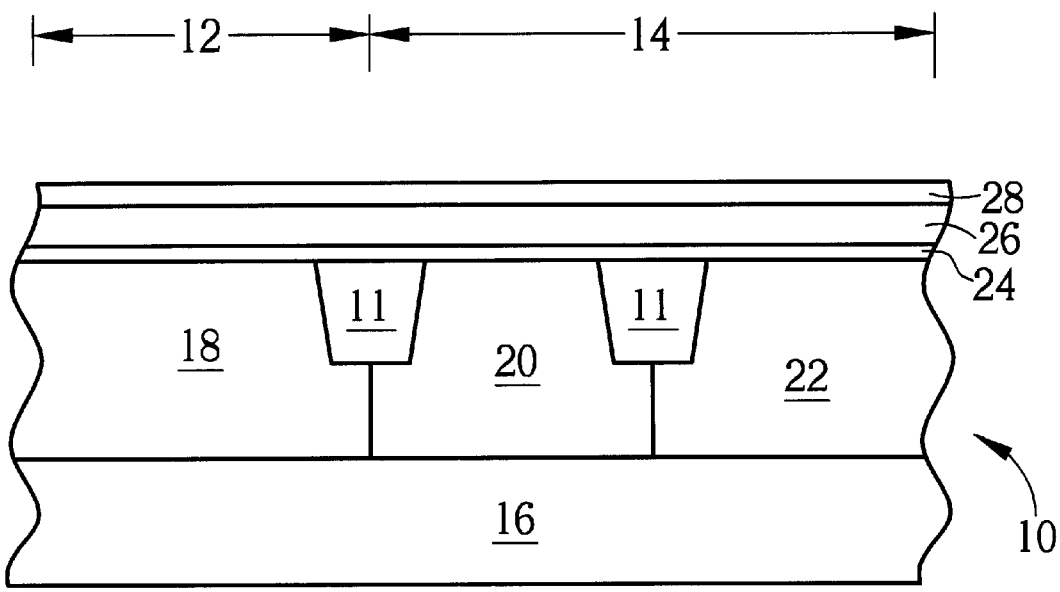
FIG. 1 to FIG. 8 are the cross-sectional schematic diagrams of manufacturing an embedded memory MOS by a prior art method.
Figure 2:
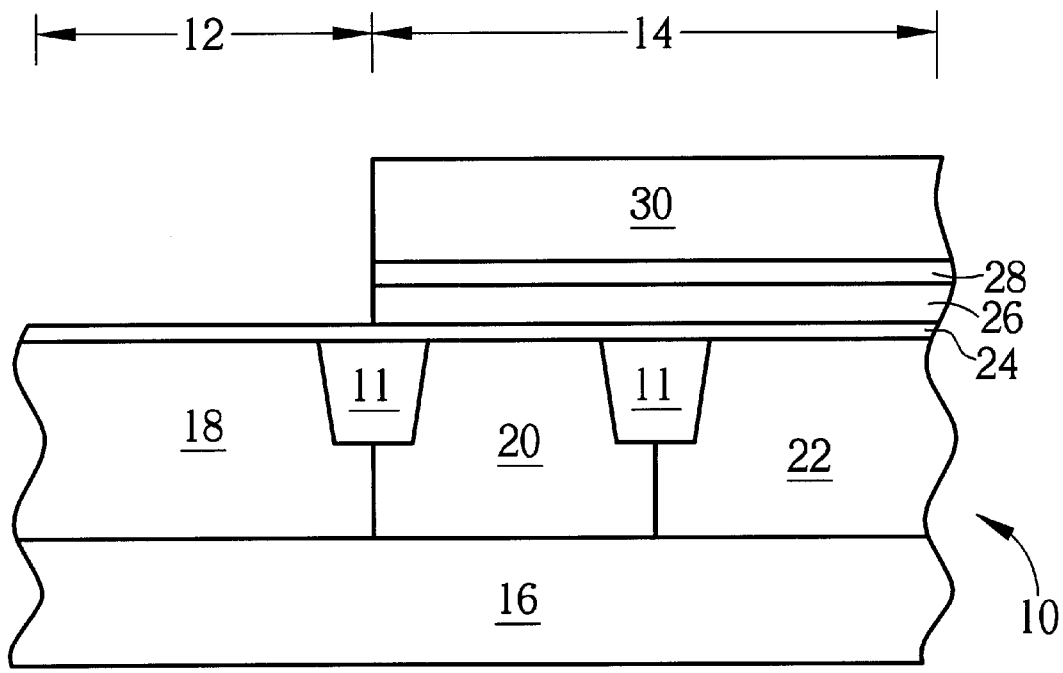
Figure 3:
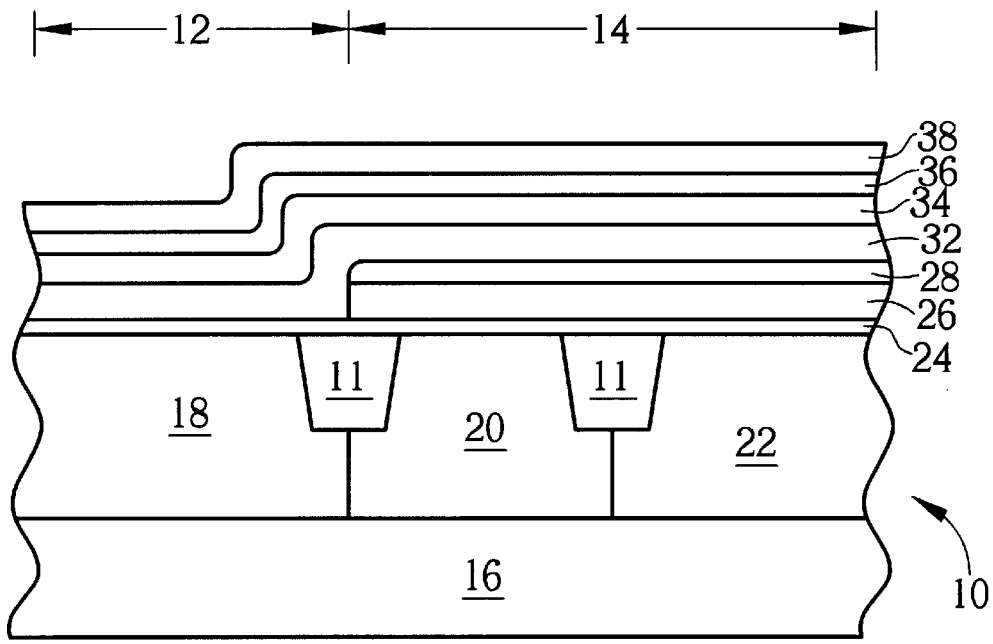
Figure 4:
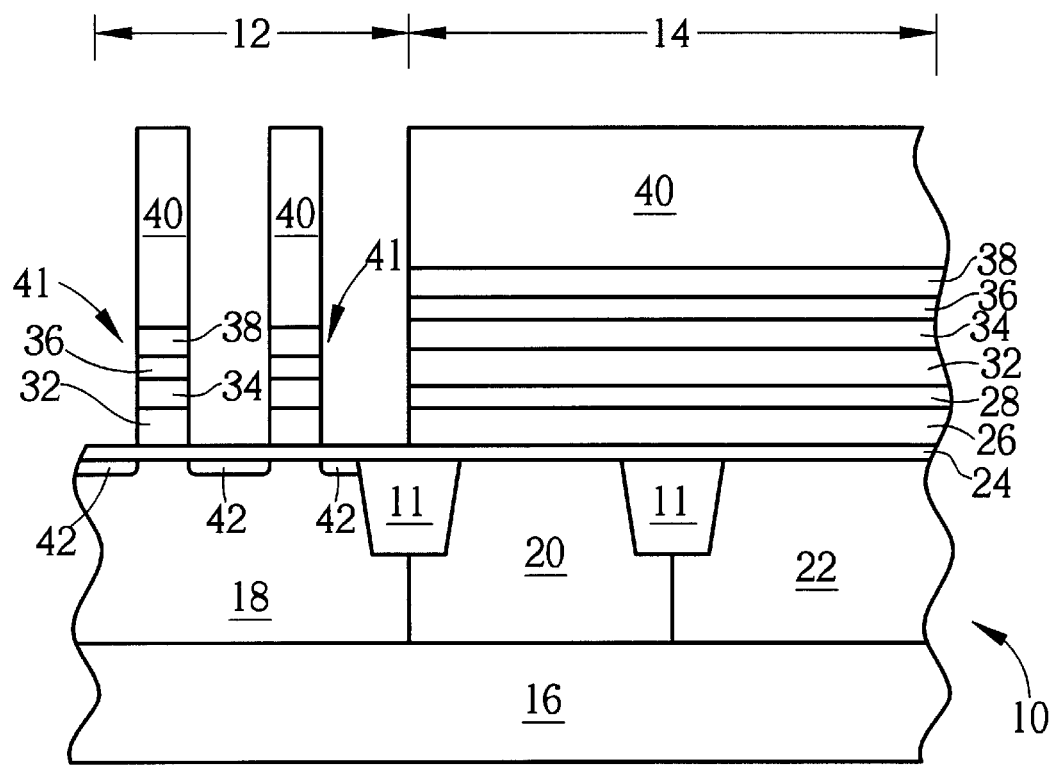
Figure 5:
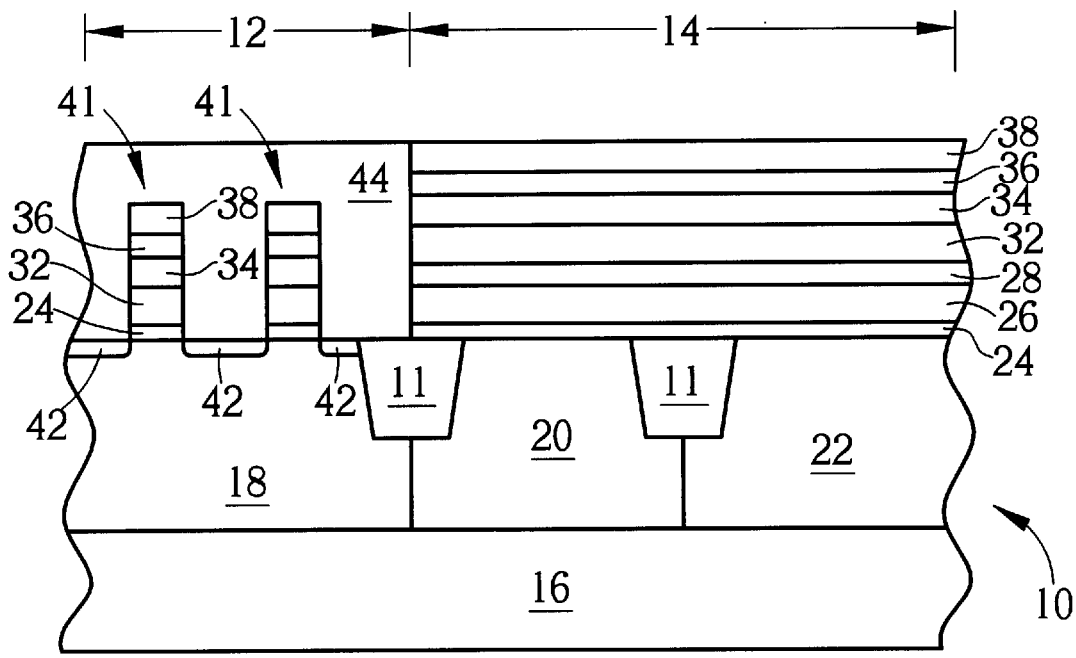
Figure 6:
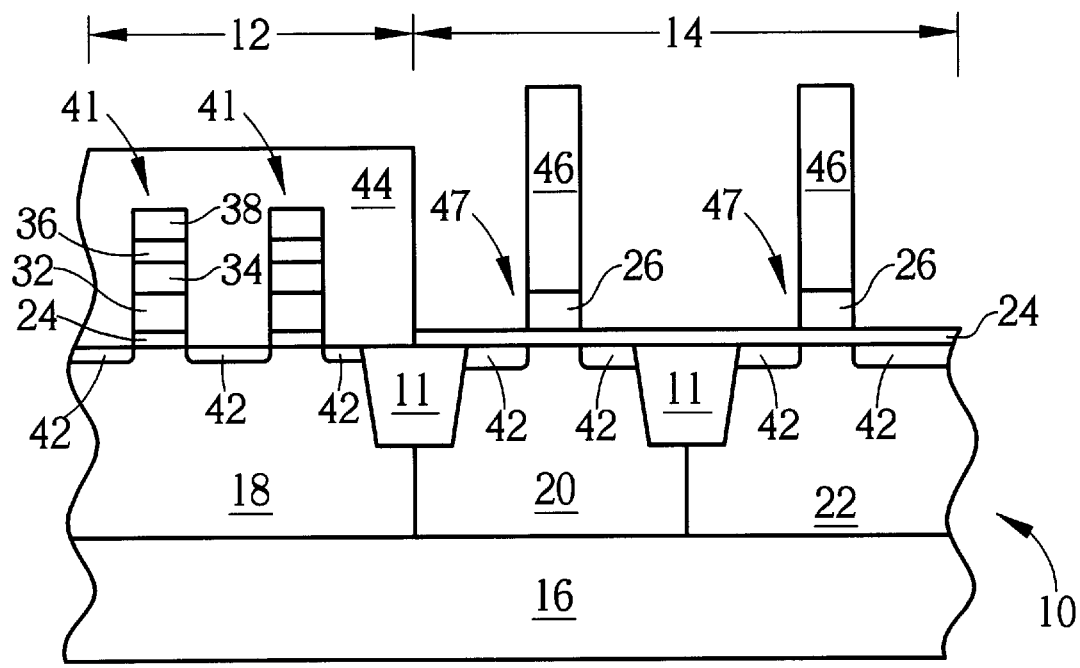
Figure 7:
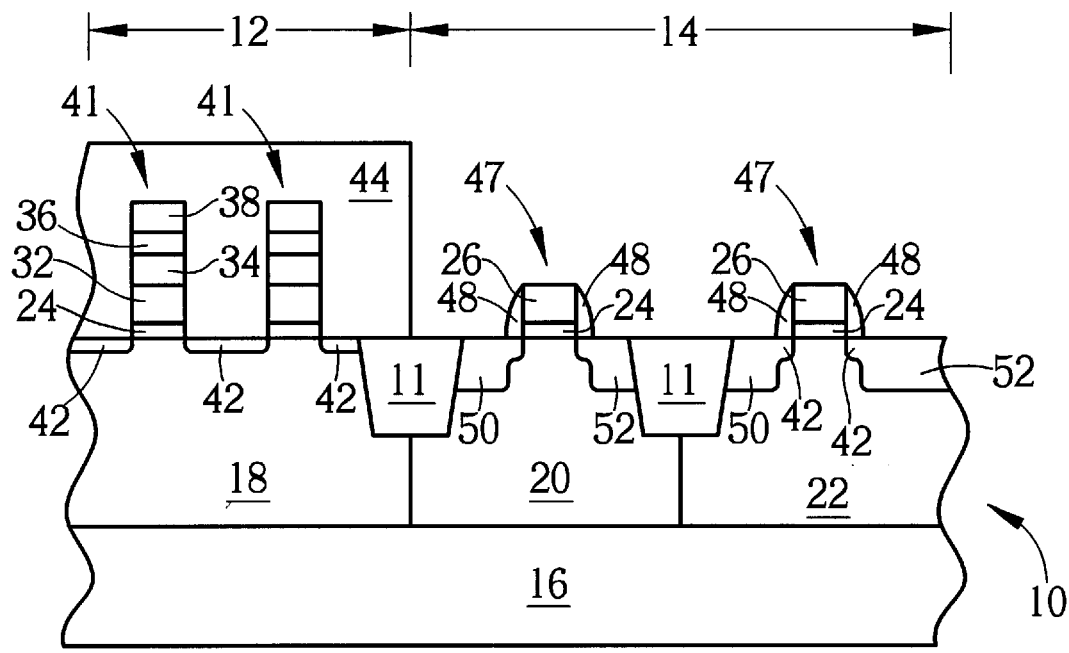
Figure 8:
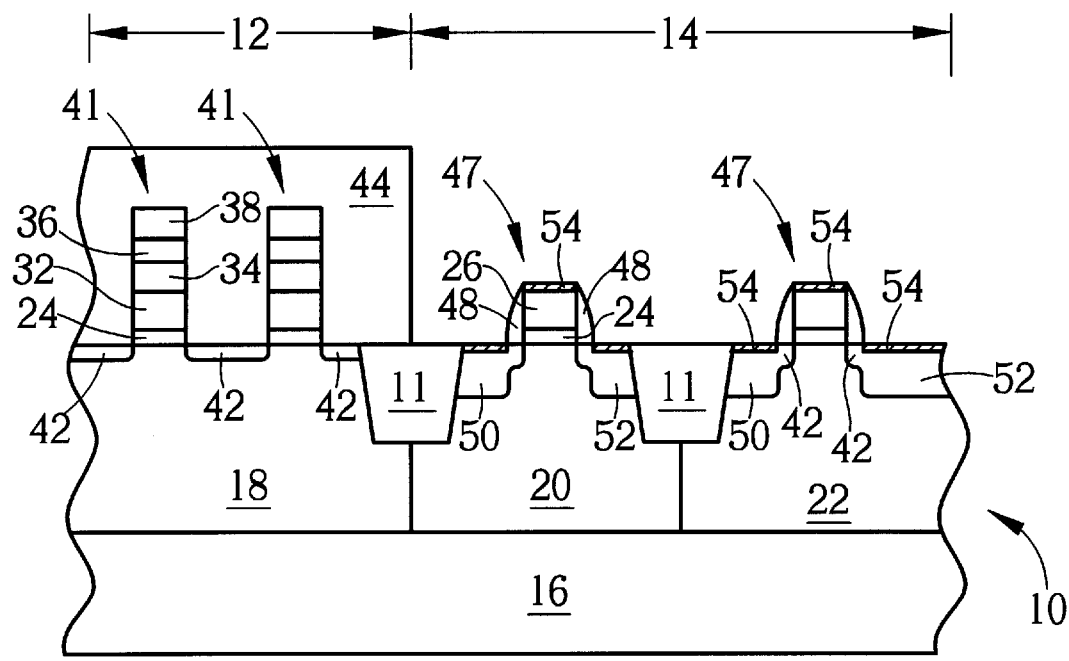

Please refer to FIG. 9 to FIG. 16. FIG. 9 to FIG. 16 are the cross-sectional schematic diagrams of the method for making an embedded memory MOS on a semiconductor wafer 60 according to the present invention. The semiconductor wafer 60 comprises a silicon substrate 66, and a memory array area 62 and a periphery circuits region 64 defined on the surface of the silicon substrate 66. The memory array area 62 further comprises at least one single cell-well 68, and the periphery circuits region 64 further comprises at least one P well 70 and at least one N well 72. Each area is isolated by a plurality of shallow trench isolations 61.

Figure 9:
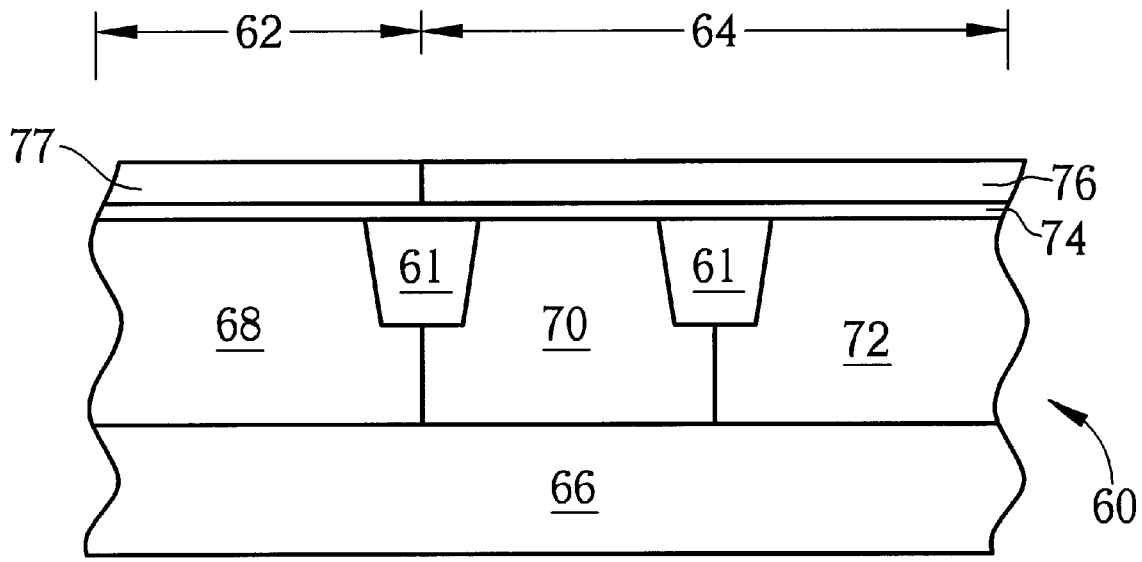
FIGS. 9 to 16 are the cross-sectional schematic diagrams of manufacturing an embedded memory MOS by the present invention method.

As shown in FIG. 9, the method according to the present invention first involves forming a dielectric layer 74 and an undoped polysilicon layer 76, respectively, on the surface of the semiconductor wafer 60. The dielectric layer 74 is composed of silicon dioxide for use as the gate oxide layer of each MOS. Then, a photolithographic process is performed, followed by an ion implantation process on the undoped polysilicon layer 76 in the memory array area 62 in order to transform the undoped polysilicon layer 76 in the memory array area 62 into a doped polysilicon layer 77.

Figure 10:
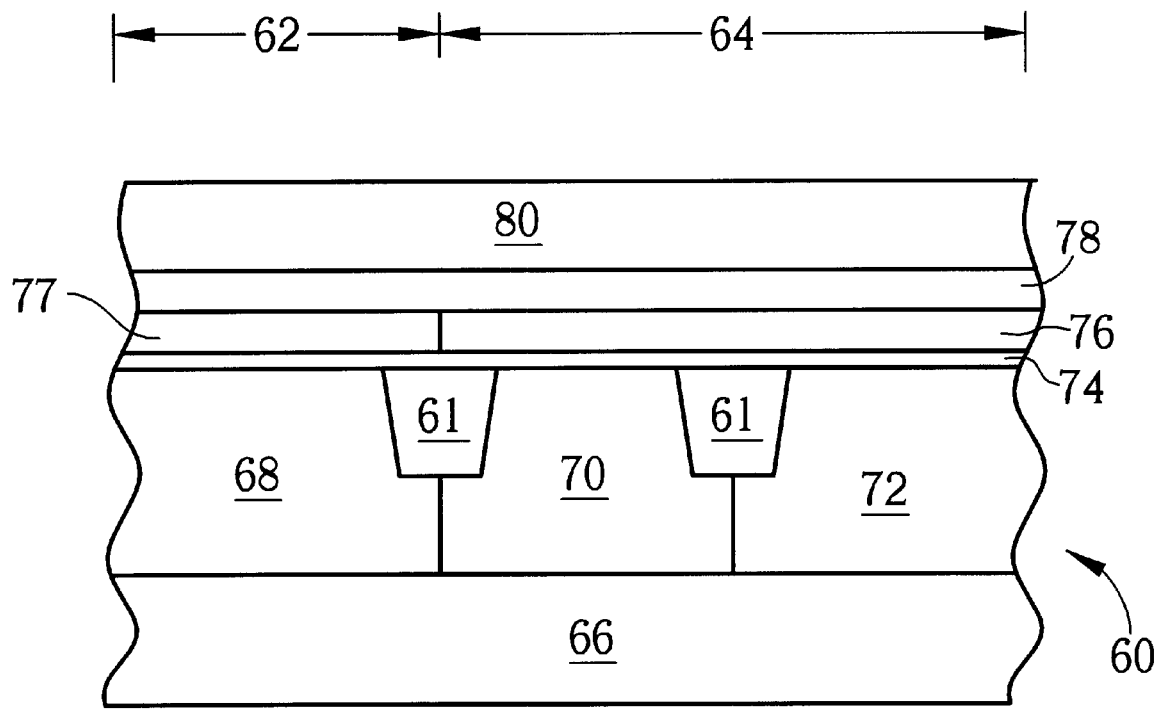
Figure 11:
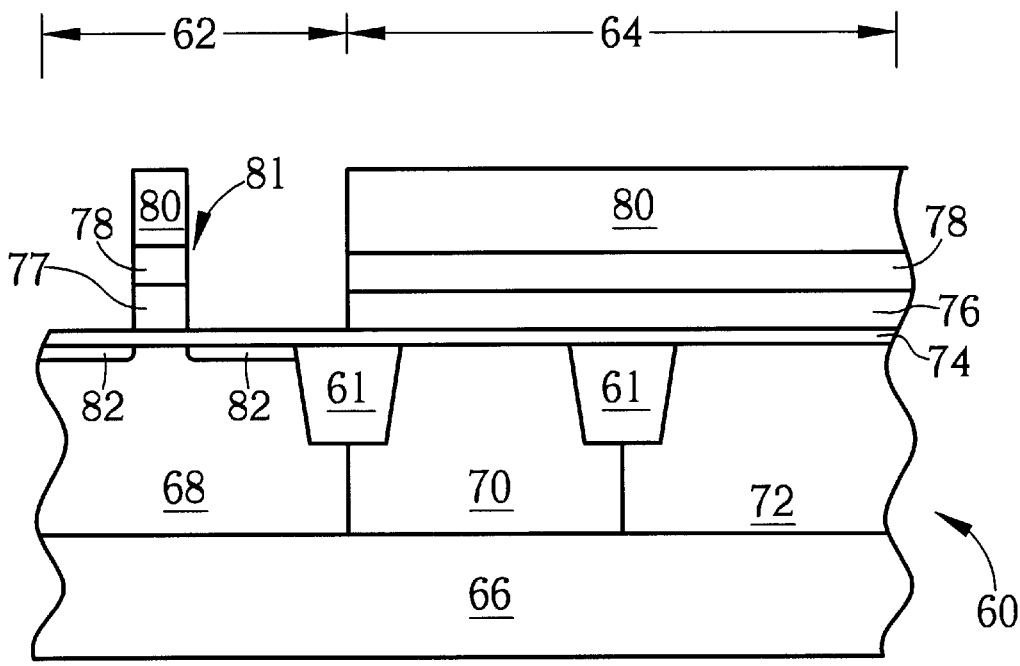

Thereafter, as shown in FIG. 10, a protective layer 78 and a photoresist layer 80 are formed, respectively, on the surface of the semiconductor wafer 60. The protective layer 78 is composed of a silicon nitride compound, and a Silicon-oxy-nitride($SiO_xN_y$) layer(not indicated) is positioned between the protective layer 78 and the undoped polysilicon layer 76 for use as an anti-reflection coating (ARC). As shown in FIG. 11, a photolithographic, exposure and development process is performed to define a plurality of gate patterns 81 in the photoresist layer 80 above the single cell-well 68 in the memory array area 62. Next, the patterns in the photoresist layer 80 are used as a hard mask for etching the protective layer 78 and the doped polysilicon layer 77 in the memory array area 62 down to the surface of the dielectric layer 74. Then, an ion implantation process is used to form lightly doped drains 82 (LDO) of each MOS in the memory array area 62.

Figure 12:
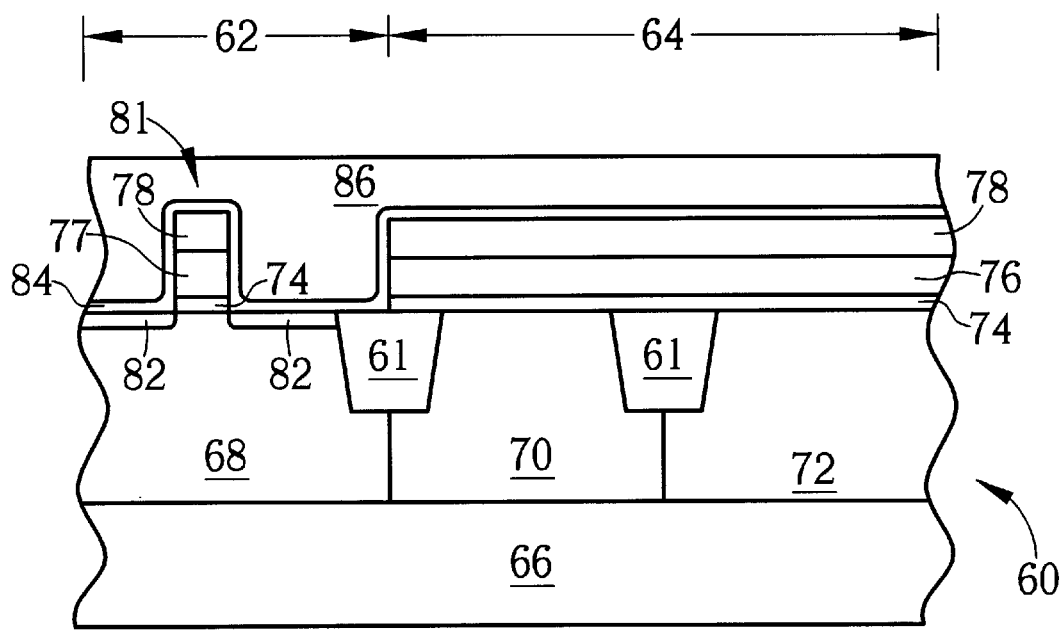
Figure 13:
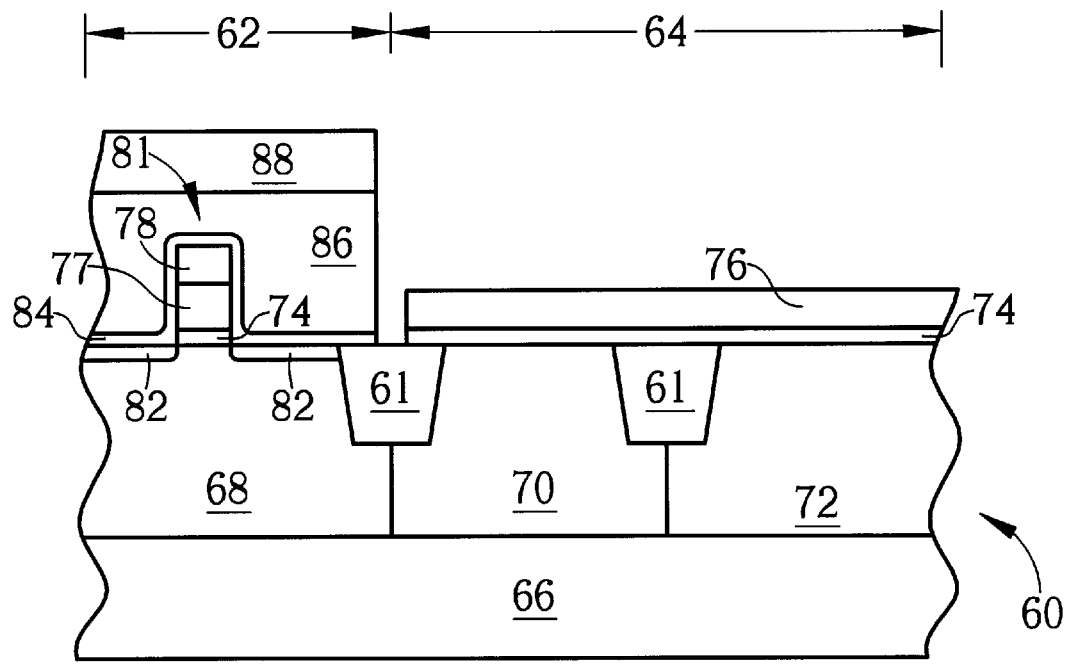

After removing the photoresist layer 80 and the gate oxide layer 74 not completely covered by each gate 81, as shown in FIG. 12, a silicon nitride layer 84 and a dielectric layer 86 is then formed, respectively, on the surface of the semiconductor wafer 60 and covering the surface of each gate 81 in the memory array area 62. Thereafter, as shown in FIG. 13, a photoresist layer 88 is formed in the memory array area 62 and used as a hard mask to remove the dielectric layer 86, the silicon nitride layer 84, and the protective layer 78 in the periphery circuits region 64.

Figure 14:
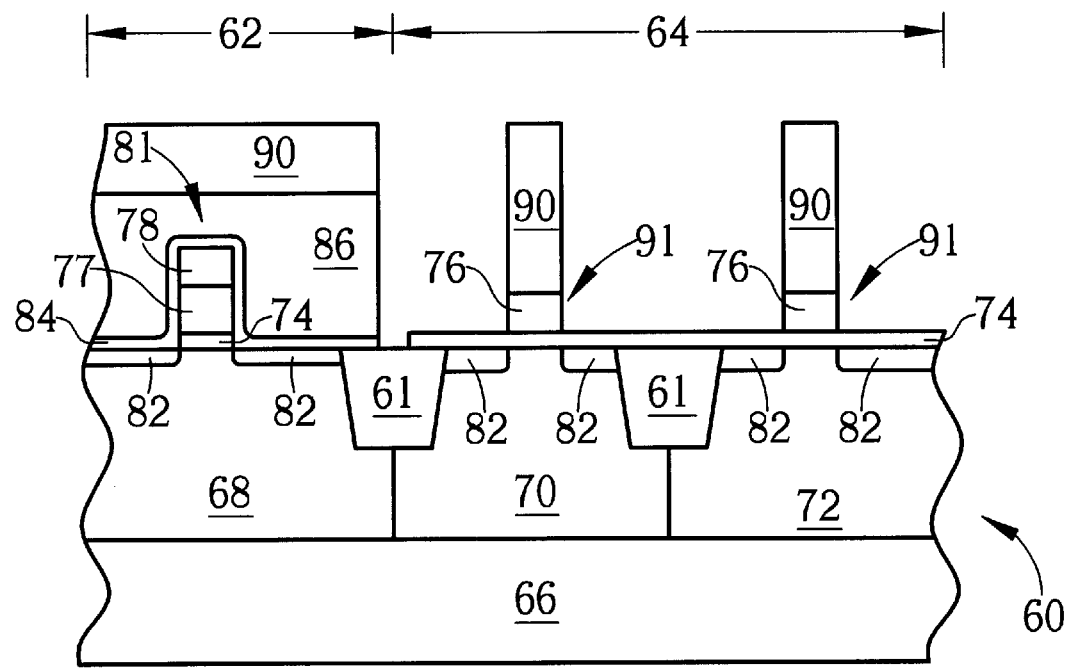

As shown in FIG. 14, a photoresist layer 90 is formed on the surface of the semiconductor wafer 60, whereby prior to the formation of the photoresist layer 90, a silicon-oxy-nitride($SiO_xN_y$)layer (not indicated) can be positioned on the surface of the semiconductor wafer 60 as an anti-reflection coating(ARC). Thereafter, a photolithographic process is used to define a plurality of gate patterns 91 in the photoresist layer 90 above the N well 72 and the P well 70 in the periphery circuits region 64. Then, the patterns in the photoresist layer 90 is used as a hard mask to etch the undoped polysilicon layer 76 in the periphery circuits region 64 down to the surface of the dielectric layer 74 to form gates 91 of each MOS in the periphery circuits region 64. Next, an ion implantation process is used to form lightly doped drains (LDD) 82 of each MOS in the periphery circuits region 64.

Figure 15:
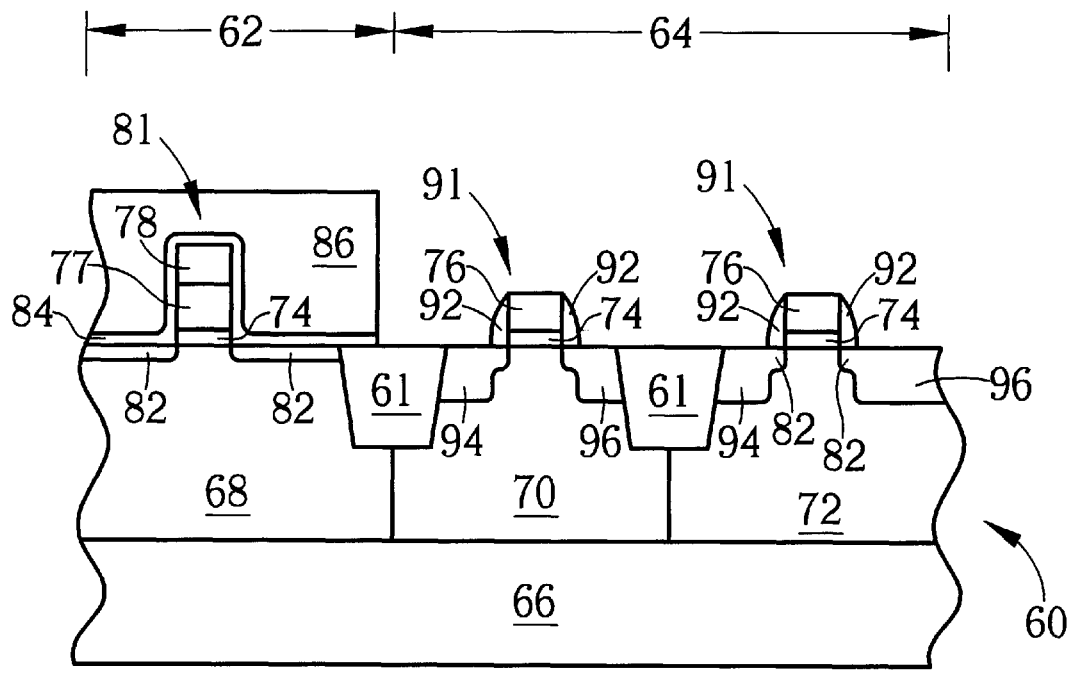

Thereafter, the photoresist layer 90 and the silicon-oxy-nitride layer(not indicated) beneath the photoresist layer 90 are removed. As shown in FIG. 15, a silicon nitride layer (not indicated) is formed and covers the surfaces of each gate 91 in the periphery circuits region 64. Two photolithographic and etching processes(PEP) are used for making the successive process of the PMOS and the NMOS, respectively. More specifically, a first PEP is used to etch the silicon nitride layer around the gate 91 above the P well 70 in the periphery circuits region 64 to form spacers 92, followed by the use of an ion implantation process to form a source 94 and drain 96 of the NMOS in the P well 70. Thereafter, a second PEP is used to etch the silicon nitride layer around the gate 91 above the N well 72 in the periphery circuits region 64 to form spacers 92. Then, an ion implantation process is used to form the source 94 and drain 96 of the PMOS in the N well 72. In the above-mentioned two ion implantation processes, the undoped polysilicon layer 76 in each gate 91 above the P well 70 and the N well 72 are doped.

Figure 16:
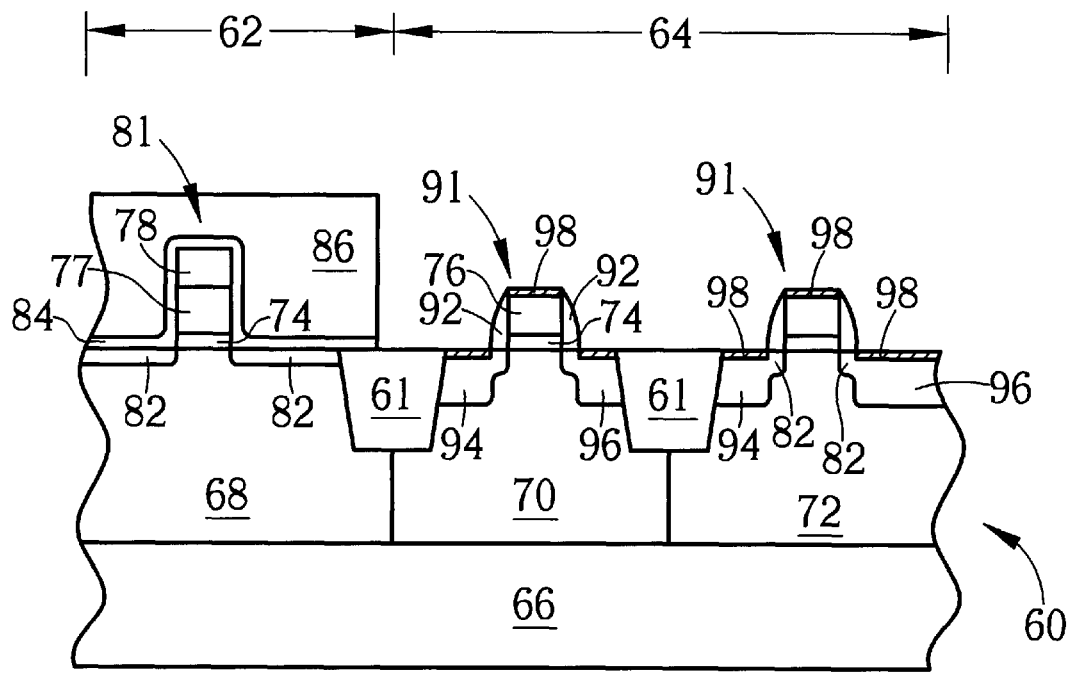

As shown in FIG. 16, after completely forming the source 94 and drain 96 of each MOS in the periphery circuits region 64, the gate silicon oxide layer 74 not covered by each gate 91 is removed. Then, a metal layer(not indicated) composed of Copper(Co) is deposited on the surface of the semiconductor wafer 60, and covering the surfaces of each source 94, drain 96 and gate 91 in the periphery circuits region 64. Then, a first rapid thermal process(RTP) with a temperature range of 400°~600° C. and a heating duration of 10~50 seconds is performed to allow the Copper atoms in the metal layer to diffuse into the surfaces of each source 94, drain 96 and gate 91. Thereafter, a wet etching process is used for removing the unreacted metal layer on the surface of the semiconductor wafer 60. Finally, a second rapid thermal process(RTP) with a temperature range of 600°~800° C. and a heating duration of 10~50 seconds is used to form a self aligned silicide layer 98 on the surfaces of each 94, drain 96 and gate 91 in the periphery circuits region 64. The metal layer can also be composed of Titanium(Ti), Nickel(Ni) or Molybdenum(Mo).

In summary, the method according to the present invention for making an embedded memory MOS involves first forming a gate silicon oxide layer 74, an undoped polysilicon layer 76 and a protective layer 78 on the surface of the semiconductor wafer 60. Then, a gate 81 structure of each MOS is formed in the memory array area 62. Thereafter, a silicon nitride layer 84 and a dielectric layer 86 is formed, respectively, on the surface of the semiconductor wafer 60. Finally, the dielectric layer 86, the silicon nitride layer 84 and the protective layer 78 in the periphery circuits region 64 are removed to form the gate 91 structure of each MOS in the periphery circuits region 64.

In contrast to the prior method of forming the embedded memory MOS, the present invention uses the same polysilicon layer as the conductive layer in both the periphery circuits region and the memory array area. As a result, many chemical deposition and etching procedures are no longer required, to decrease process complexity and lower production cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making an embedded memory metal oxide semiconductor (MOS), the method comprising:

providing a semiconductor wafer, with a memory array area and a periphery circuits region defined on the surface of a silicon substrate of the semiconductor wafer;

forming a first dielectric layer and an undoped polysilicon layer, respectively, on the surface of the semiconductor wafer;

performing a first ion implantation process in the undoped polysilicon layer in the memory array area to transform the undoped polysilicon layer in the memory array area into a doped polysilicon layer;

forming a protective layer and a first photoresist layer, respectively, on the surface of the semiconductor wafer;

performing a first photolithographic process so as to define a plurality of gate patterns in the first photoresist layer in the memory array area;

applying the patterns in the first photoresist layer as a hard mask for etching the protective layer and the doped polysilicon layer in the memory array area down to the surface of the first dielectric layer;

performing a second ion implantation process for forming lightly doped drains(LDD) of a plurality of MOS devices in the memory array area;

removing the first photoresist layer;

forming a first silicon nitride layer and a second dielectric layer, respectively, on the surface of the semiconductor wafer and covering the surfaces of each gate in the memory array area;

removing the second dielectric layer, the first silicon nitride layer and the protective layer in the periphery circuits region;

forming a second photoresist layer on the surface of the semiconductor wafer;

performing a second photolithographic process so as to define a plurality of gate patterns in the second photoresist layer in the periphery circuits region;

applying the patterns in the second photoresist layer as a hard mask to etch the undoped polysilicon layer in the periphery circuits region down to the surface of the first dielectric layer, so as to form gates of a plurality of MOS devices in the periphery circuits region;

performing a third ion implantation process so as to form lightly doped drains(LDD) of each MOS device in the periphery circuits region;

removing the second photoresist layer;

forming a second silicon nitride layer on the surface of the semiconductor wafer, and covering the surfaces of each gate in the periphery circuits region;

performing an etching process for removing part of the second silicon nitride layer in the periphery circuits region so as to form a spacer on either side of each gate in the periphery circuits region; and performing a fourth ion implantation process so as to form a source and drain of each MOS in the periphery circuits region.

2. The method of claim 1 wherein the first dielectric layer is composed of silicon dioxide($SiO_2$) for use as the gate oxide layer of each MOS.

3. The method of claim 1 wherein the first protective layer is composed of a silicon nitride compound, and a first silicon-oxy-nitride($SiO_xN_y$) layer is positioned between the protective layer and the undoped polysilicon layer for use as an anti-reflection coating(ARC).

4. The method of claim 1 wherein a second silicon-oxy-nitride($SiO_xN_y$) layer is formed on the surface of the semiconductor wafer as an anti-reflection coating before forming the second photoresist layer.

5. The method of claim 4 wherein the second silicon-oxy-nitride layer formed beneath the second photoresist layer is removed following the removal of the second photoresist layer.

6. The method of claim 1 wherein the method following the formation of the source and drain of each MOS in the periphery circuits region comprises:

forming a metal layer on the surface of the semiconductor wafer and covering the surfaces of each source, drain and gate in the periphery circuits region;

performing a first rapid thermal process;

performing a wet etching process for removing the unreacted metal layer on the surface of the semiconductor wafer; and performing a second rapid thermal process.

7. The method of claim 6 wherein the metal layer is composed of cobalt(Co), titanium(Ti), nickel(Ni) or molybdenum(Mo).

8. The method of claim 6 wherein the first rapid thermal process has a temperature range of 400° C.~600° C. and a heating duration of 10~50 seconds, and the second rapid thermal process has a temperature range of 600° C.~800° C. and a heating duration of 10~50 seconds.

9. A method for making an embedded memory metal oxide semiconductor (MOS), the method comprising:

provamiding a semiconductor wafer, with a memory array area and a periphery circuits region defined on the surface of the silicon substrate, the memory array area comprises at least one single cell-well, and the periphery circuits region comprises at least one N-well and at least one P-well;

forming a first dielectric layer and an undoped polysilicon layer, respectively, on the surface of the semiconductor wafer;

performing a first ion implantation process in the undoped polysilicon layer in the memory array area to transform the undoped polysilicon layer in the memory array area into a doped polysilicon layer;

forming a protective layer and a first photoresist layer, respectively, on the surface of the semiconductor wafer;

performing a first photolithographic process so as to define a plurality of gate patterns in the first photoresist layer above the single cell-well in the memory array area;

applying the patterns in the first photoresist layer as a hard mask for etching the protective layer and the doped polysilicon layer in the memory array area down to the surface of the first dielectric layer;

removing the first photoresist layer;

performing a second ion implantation process to form lightly doped drains(LDD) of a plurality of MOS devices in the memory array area;

forming a first silicon nitride layer and a second dielectric layer, respectively, on the surface of the semiconductor wafer and covering the surface of each gate in the memory array area;

removing the second dielectric layer, the first silicon nitride layer and the protective layer in the periphery circuits region;

forming a second photoresist layer on the surface of the semiconductor wafer;

performing a second photolithographic process so as to define a plurality of gate patterns in the second photoresist layer above the N-well and the P-well in the periphery circuits region;

applying the patterns in the second photoresist layer as a hard mask to etch the undoped polysilicon layer in the periphery circuits region down to the surface of the first dielectric layer, so as to form gates of a plurality of MOS devices in the periphery circuits region;

removing the second photoresist layer;

performing a third ion implantation process so as to form lightly doped drains of each MOS device in the periphery circuits region;

forming a second silicon nitride layer on the surface of the semiconductor wafer and covering the surface of each gate in the periphery circuits region;

performing an etching process for removing the second silicon nitride layer surrounding the gate above the P-well in the periphery circuits region to form a first spacer, and performing a fourth ion implantation process so as to form a source and drain of the NMOS in the P-well; and performing an etching process for removing the second silicon nitride layer surrounding the gate above the N-well in the periphery circuits region to form a second spacer, and performing a fifth ion implantation process so as to form a source and drain of the PMOS in the N-well.

10. The method of claim 9 wherein the first dielectric layer is composed of silicon dioxide($SiO_2$) for use as the gate oxide layer of each MOS.

11. The method of claim 9 wherein the protective layer is composed of a silicon nitride compound, and a first silicon-oxy-nitride($SiO_xN_y$) layer is positioned between the protective layer and the undoped polysilicon layer for use as an anti-reflection coating(ARC).

12. The method of claim 9 wherein a second silicon-oxy-nitride($SiO_xN_y$) layer is formed on the surface of the semiconductor wafer as an anti-reflection coating before forming the second photoresist layer.

13. The method of claim 12 wherein the second silicon-oxy-nitride layer formed beneath the second photoresist layer is removed following the removal of the second photoresist layer.

14. The method of claim 9 wherein the fourth and fifth ion implantation processes separately dope the undoped polysilicon layer in each gate above the P-well and N-well.

15. The method of claim 9 wherein the method following the formation of the source and drain of each MOS in the periphery circuits region comprises:

forming a metal layer on the surface of the semiconductor wafer and covering the surfaces of each source, drain and gate in the periphery circuits region;

performing a first rapid thermal process;

performing a wet etching process for removing the unreacted metal layer on the surface of the semiconductor wafer; and performing a second rapid thermal process.

16. The method of claim 15 wherein the metal layer is composed of cobalt(Co), titanium(Ti), nickel(Ni) or molybdenum(Mo).

17. The method of claim 15 wherein the first rapid thermal processing has a temperature range of 400° C.~600° C. and a heating duration of 10~50 seconds, and the second rapid thermal process has a temperature range of 600° C.~800° C. and a heating duration 10~50 seconds.

* * * * *